United States Patent [19]

Heimlicher

[11] Patent Number: 5,675,143
[45] Date of Patent: Oct. 7, 1997

[54] PROXIMITY SWITCH

[75] Inventor: Peter Heimlicher, Freiburg, Switzerland

[73] Assignee: Optosys AG, Villas-Sur-Glane, Switzerland

[21] Appl. No.: 561,007

[22] Filed: Nov. 21, 1995

[30] Foreign Application Priority Data

Dec. 22, 1994 [CH] Switzerland ............... 03886/94

[51] Int. Cl.$^6$ ............................................. G01D 5/34
[52] U.S. Cl. .................... 250/221; 250/222.1; 340/555
[58] Field of Search ..................... 250/221, 222.1; 340/555, 556, 557; 341/31

[56] References Cited

U.S. PATENT DOCUMENTS

| | | | |
|---|---|---|---|
| 3,603,800 | 9/1971 | Andres | 250/222.1 |
| 3,886,544 | 5/1975 | Narodny | 341/31 |
| 4,564,756 | 1/1986 | Johnson | 250/221 |
| 4,814,600 | 3/1989 | Bergstrom | 341/31 |
| 5,138,150 | 8/1992 | Duncan | 250/221 |
| 5,397,890 | 3/1995 | Schueler et al. | 250/221 |
| 5,449,899 | 9/1995 | Wilson | 340/555 |

FOREIGN PATENT DOCUMENTS

| | | |
|---|---|---|
| 0384353A2 | 8/1990 | European Pat. Off. . |
| 0384353A3 | 11/1991 | European Pat. Off. . |
| 4027367 | 7/1991 | Germany . |
| 4013743 | 11/1991 | Germany . |
| 2178840 | 2/1987 | United Kingdom . |

OTHER PUBLICATIONS

Patent Abstracts of Japan, vol. 9, No. 246 (P-393) (1969) Oct. 3, 1985, JP Publication No. 60-98381.

*Primary Examiner*—Edward P. Westin
*Assistant Examiner*—Kevin Pyo
*Attorney, Agent, or Firm*—Foley & Lardner

[57] ABSTRACT

The use of a single concave mirror (1) serving as an optical focusing and directing element for a proximity switch allows an increased sensitivity at equal construction size or a substantial reduction in the construction size with equal sensitivity. In a preferred embodiment, the concave mirror is divided into two halves (3, 4) by a supporting plate (2) for the light source (5) and the light sensor (6), the halves (3, 4) of the mirror serving the purpose of directing the emitted light (8) and focusing the reflected light (9) onto the light sensor. In order to increase the resistance to difficult environmental conditions, the concave mirror (1) or its portions (3, 4) can be filled with a substance which is transparent to the light of the light source (5). Metallized plastics material is a suitable material for the mirror, especially in combination with the mentioned filling substance.

11 Claims, 1 Drawing Sheet

PROXIMITY SWITCH

BACKGROUND OF THE INVENTION

The present invention refers to a proximity switch having at least one light source and at least one light sensor.

Optical proximity switches of the type at issue generally comprise a light source and a light-sensitive element, hereinafter referred to as a light sensor. The light of the light source is preferably focused and directed to the direction to be monitored for the approaching of an object. If such an object approaches the proximity switch from this direction, light is reflected by the object and impinges on the sensor, generally also in a focused manner. As the object closes in, the intensity of the reflected light increases. The proximity switch responds when a threshold value is exceeded.

An embodiment comprising optical fibers is described in GB-A-2,178,840. However, the effective range of this embodiment is small because of a high diffusion of the light emerging from the optical fiber and the small diameter of the optical fiber receiving the light. Moreover, the intensity of the light which is reflected onto the proximity switch also decreases past a given minimum distance.

As already mentioned, a light and focusing optics are provided in most cases. These serves the purpose of increasing the sensitivity and, thus, the distance at which the proximity switch responds. At the same time, it provides a accurate response of the proximity switch even in the case of objects having a poorly reflecting surface.

The use of lenses and prisms is known from DE-A1-40 13 743. The disclosed proximity switch in that reference responds to the presence of an object in a predetermined space element which is defined by the intersection of the emitted light beam and the field of observation of the light sensor. The provided lens system serves the purpose of focusing the light of the light source and of the light which is reflected back to the switch, onto the light sensor. By a rotation of the prism, it is possible to adjust the distance of the space element from the proximity switch.

An inconvenience of this known embodiment is the limited possibility of miniaturization since a respective lens for the light source and the light sensor must be provided whose size cannot be indefinitely reduced and whose utilization of the total available cross-section is unfavorable.

SUMMARY OF THE INVENTION

It is an object of the present invention to provide a proximity switch allowing for smaller embodiments with the best possible response characteristics.

This object is attained by means of a proximity switch wherein a first portion of a concave mirror is associated to a light source and a second portion of the concave mirror is associated to a light sensor, in such a manner that the light emitted by the light source is directed in a direction to be monitored by the first portion of the concave mirror, and the light which is reflected in the direction of the proximity switch by an object approaching from said monitored direction is directed to the light sensor by the second portion of the concave mirror. The dependent claims refer to preferred embodiments.

Generally speaking, the proximity switch of the invention is provided with a divided concave mirror serving as an optical focusing and directing element. One portion of the concave mirror is illuminated by the light source, focuses the light, and directs it in the direction of observation. A second portion of the concave mirror serves to concentrate the light impinging on the proximity switch, e.g. the light which is reflected by an approaching object. By the incorporation of the necessary optics in a single optical element, i.e. the concave mirror, in combination with the small available sizes of light sources and light sensors such as LEDs and optotransistors, the proximity switch of the invention can be made very small and compact.

BRIEF DESCRIPTION OF THE DRAWINGS

The invention is further explained hereinafter by way of exemplary embodiments with reference to accompanying drawings.

DETAILED DESCRIPTION OF THE INVENTION

Figure 1:
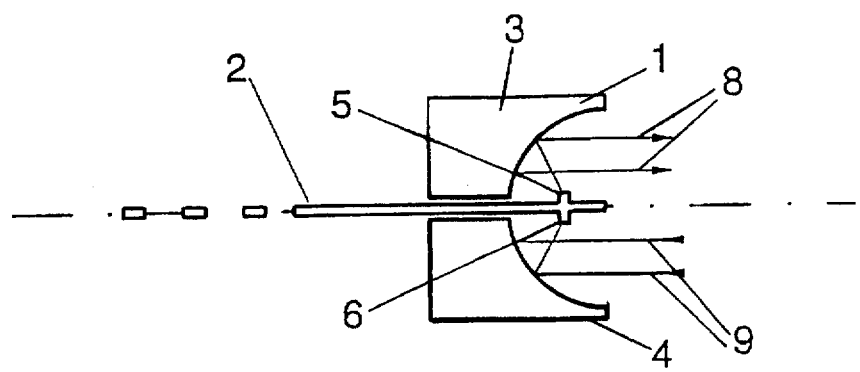
FIG. 1 shows a cross-section of the proximity switch of the invention.

According to the basic construction of a proximity switch of the invention as shown in FIG. 1, a concave mirror 1 is shown which is divided into two halves 3 and 4 by a supporting plate 2. On the upper side of a front end of supporting plate 2, a light source 5 is provided, e.g. a light emitting diode (LED). On the lower side of the front end of supporting plate 2, a light sensor 6, such as a phototransistor or a photodiode is provided. Preferably, supporting plate 2 is provided with the required electric connection lines for each of the light source 5 and the light sensor 6. More particularly, the supporting plate 2 may be a printed circuit board, so that the remaining, non-represented electronic components of the proximity switch may also be disposed thereon.

The light emitted by light source 5 is deviated by the upper half of the concave mirror and emitted in the form of a light beam 8. Now, if an object having, for example, a diffusely reflecting surface approaches the proximity switch, a certain proportion of the impinging light 8 will be reflected onto the lower half 4 of the concave mirror of the proximity switch. The lower half of the concave mirror 4 largely concentrates the impinging light 9 onto the light sensor 6. The amount of light reflected onto the proximity switch increases with the increasing proximity of the object, so that at a certain distance, an intensity threshold of the light sensor 6 is exceeded and the proximity switch produces an indicating signal.

In view of the operation of the proximity switch, it is desirable to direct a maximum proportion of the total light produced by the light source into the monitored direction and, conversely, to obtain a maximally efficient focusing of the reflected light onto the light sensor in order to compensate, amongst other things, for the loss of light intensity by the reflection by the approaching object.

In order to prevent the light from the light source 5 from illuminating the light sensor 6 directly, the supporting plate 2 is impermeable for the light of the light source and preferably divides the mirror completely.

As much as possible, light sensor 6 and light source 5 are disposed in the focus of the respective halves of the concave mirror. The emitted light is thus emitted approximately parallel to the optical axis, and the light sensor assembly, consisting of light sensor 6 and of the lower concave mirror half 4, also has a maximum sensitivity for such light. In this case, the optical axis is defined by the connecting line between the focus and the closest point of the concave mirror which, as the case may be, is obtained by virtual completion of the respective concave mirror half. In the represented, exemplary embodiment, the optical axes of the two concave mirror halves coincide.

Figure 2:
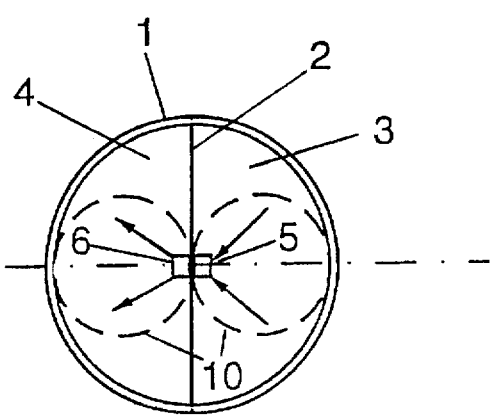
FIG. 2 shows a plane view for comparison of an embodiment with lenses and the embodiment of the invention.

An advantage of the proximity switch of the invention appears in considering FIG. 2, which shows a schematical top view of a proximity switch of the invention. Two lenses 10 such as would be provided in a proximity switch of conventional construction of the same mounting size are shown in dotted lines. If the diameter of the concave mirror 1 is designated by d, it has a cross-sectional area of $\frac{1}{4}\pi\, d^2$. This results in the emitting surface for the emitted light 8 and the receiving cross-section for the reflected light 9 each having a crosssectional area of $\frac{1}{8}\pi\, d^2$, respectively.

In contrast, the sensor of a conventional construction only has the cross-sectional area of lenses 10, each of which has a diameter of d/2 and consequently a passing area of $\frac{1}{4}\pi\, (d/2)^2 = \frac{1}{16}\pi\, d^2$. The surfaces of the proximity switch of the instant invention that are available for light reception and emission are thus twice as large as those of the traditional construction with lenses.

Another difference results from the fact that the optical axes of the lenses have a distance of d/2, while there is only one optical axis in the proximity switch of the invention according to the disclosed embodiment. It can therefore be expected that even if an object is very close to the sensor, there will still be enough light reflected onto the light sensor to exceed the switching threshold. In traditional constructions, however, a decrease of the illuminating intensity in the case of very near objects must be expected unless special near-range adjustments are effected.

Figure 3:
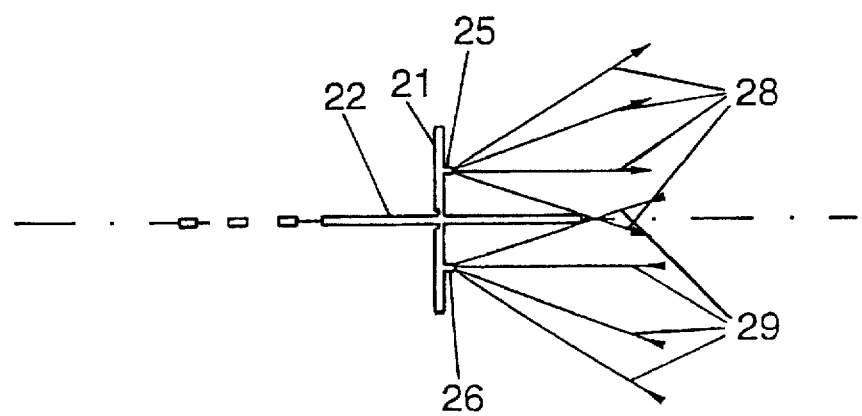
FIG. 3 shows a cross-section of a simple embodiment of a proximity switch.

Finally, FIG. 3 shows a simplified construction which served as a starting point in the development of the present proximity switch. A light source 25 and a light sensor 26 are disposed on a flat support 21 in the form of a plate. Again, a separating wall 22 is disposed between them which is approximately perpendicular to the support 21 and substantially impermeable to the light emitted by the light source 25. Both support 21 and separating wall 22 are provided with the necessary electrical connections for the light source 25 and the light sensor 26. More particularly, they may be printed circuit boards. Besides the directing characteristics of the light source 25 with respect to the emitted light 28 and of the light sensor 26 with respect to the received light 29, this embodiment has no focusing or directing elements. It has been found, however, that no sufficient sensitivity of the proximity switch can be attained with the presently available light sources and light sensors. Also, two plates, namely separating wall 22 and support 21, must be provided with strip conductors, and light source 25 and light sensor 26 must be disposed at a suitable mutual distance. It is thus impossible to integrate these two elements in a miniaturized circuit together with the other necessary components.

The described preferred embodiment of the proximity switch allows a great number of modifications without leaving the concept of the invention, a few especially important ones being listed herebelow.

The optical separation of light source 5 and light sensor 6 may also be obtained by corresponding directional characteristics thereof, in which case supporting plate 2 does not completely divide the mirror or may be set back. The shape of the two halves 3 and 4 of the concave mirror may be varied. For example, a variety of shapes may be employed such as spherical or parabolical arrangements. It is also conceivable that the mirror halves do not result from a central division of a concave mirror but that each of the halves represents a section of a concave mirror which is not centrally divided, so that, for example, the portions of the concave mirror no longer have coincident optical axes.

It is also conceivable to prevent only the direct irradiation of the light emitted by the light source upon the light sensor and to use a single, undivided concave mirror. A preliminary condition that results is that only a small proportion of the light emitted by the light source passes to the light sensor directly or indirectly by reflection on the mirror and/or on other elements of the proximity switch, in such a manner that a detectable, evaluable increase of the light intensity results when an object is approaching.

It is evident that instead of a single, essentially punctual light source 5 or light sensor 6 of the variety disclosed, a plurality of such sources or sensors could alternatively be provided. In this context, it is also conceivable to associate each of a plurality of sectors of the concave mirror to each light source and light sensor or to a group thereof, i.e., in the simplest case, to divide concave mirror 1 into a corresponding number of segments. If this division is effected such that light sources and light sensors alternate, e.g. in the case of a quartering, if the light source is placed in quadrants 1 and 3 and the light sensor in quadrants 2 and 4, an improved sensitivity in the near field can be expected, amongst other things. Also, the division of concave mirror 1 need not be symmetrical, but with a suitable design of the division, a larger or a smaller proportion of the mirror surface can be associated to the light source than to the light sensor. Differences of the opening angle of the light source and of the light sensor, for example, may thus be compensated to be used for an optimal utilization of the mirror area.

The light source and the light sensor may also be positioned differently, e.g. in order to serve one or both of the following purposes:

- a mutual inclination of the optical axes of the portions of the concave mirror, in order to define a monitored space element by the position of the point of intersection. In this case, the portions of the concave mirror are also disposed preferably at a certain mutual distance in order to obtain a more obtuse angle of intersection;
- an dispersing or focusing characteristic of the emitted and/or received light, e.g. for an adjustment of the responding distance.

Possible light sources include all the current forms, i.e., besides light-emitting semiconductors, also filament and glow lamps. More particularly, laser light-emitting light sources such as laser diodes are also applicable, which result in an emitted light beam having a small dispersion. Likewise, all current components are applicable for the light sensors, in particular those whose output signal is a function of the received light intensity. In miniaturized executions, semiconductor elements are recommended both for the light source and for the light sensor, particularly such elements as are capable of being incorporated in an integrated circuit as a part of the required control and supply circuitry. It is also conceivable to dispose the light source and the light sensor on one and the same integrated circuit, in which case they are optically uncoupled e.g. by the chip or by a corresponding separating wall or directional characteristic.

The concave mirror may be manufactured according to essentially all known methods, i.e. besides glass whose front or back side is metal coated, it may also consist of metal coated plastics material, in particular. In order to increase its resistance to environmental influences, the mirror may be filled with a substance which is essentially transparent at least for the light of the light source. Transparent cast resins are especially suitable for this purpose.

Figure 4:
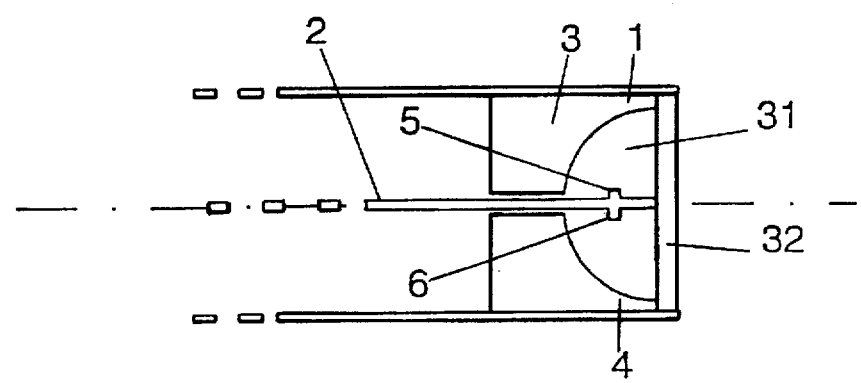
FIG. 4 shows a cross-section of another embodiment of the proximity switch.

FIG. 4 shows such an embodiment. As far as it corresponds to the embodiment of FIG. 1, the same designations have been used. The interior of concave mirror 1 is filled with a casting compound 31 which is permeable to the light emitted by light source 5. In order to avoid a dispersion of the light at its emergence from its entrance into the casting compound, a plane boundary layer is ensured by glass plate 32.

Instead of glass, other materials can be used for plate 32, preferably materials from which the required plates are simple to manufacture. In this context, quartz glass, acrylic glass, or else prefabricated disks of the material which is used to fill the concave mirror are possible. Thereby, only an almost small difference of the refractive indices for passing light may result between compound 31 and plate 32, and the requirements with respect to the planeness of this boundary layer may be reduced. Otherwise, in view of an optimal efficiency, a maximum planeness is preferable also for this inner boundary layer.

It is also possible to only provide plate 32 and not to fill out the concave mirror. Additionally, usual sealing measures can be taken in order to obtain a largely hermetical sealing of the sensor.

It should be noted that the present concave mirror is optimally adapted due to its essentially circular shape to be provided e.g. with an external thread, whereby it may be screwed into a surface. Other forms are e.g. bayonet joints. The contacting of the proximity switch is effected in one of the usual ways, e.g. by contact plugs or connecting cables.

I claim:

1. A proximity switch having at least one light source and at least one light sensor, wherein a first portion of a concave mirror is associated to the light source and a second portion of the concave mirror is associated to the light sensor, in such a manner that the light emitted by the light source is directed in a direction to be monitored by the first portion of the concave mirror, and the light which is reflected in the direction of the proximity switch by an object approaching from said monitored direction is directed to the light sensor by the second portion of the concave mirror.

2. The proximity switch of claim 1, wherein the first and the second portion of the concave mirror result from an optical separation of a concave mirror, said optical separation preventing that such amounts of light as would trigger a response of the proximity switch can pass from the light source to the light sensor without having been reflected by an approaching object.

3. The proximity switch of claim 2, wherein the separation consists of walls which are essentially parallel to the axis of the concave mirror.

4. The proximity switch of claim 2, wherein the separation is impermeable at least to the light emitted by the light source.

5. The proximity switch of claim 1, wherein the light source and/or the light sensor is disposed near or in the focus of the associated portion of the concave mirror.

6. The proximity switch of claim 1, wherein the light source and the light sensor are optoelectronic components which are disposed on opposite sides of a front end of a supporting plate, wherein said supporting plate projects into the concave mirror, and essentially results in optical separation.

7. The proximity switch of claim 1, wherein the first and the second mirror portions are equal and result from the optical separation of a concave mirror according to a symmetrical division.

8. The proximity switch of claim 1, wherein the portions of the concave mirror are filled with a substance which is transparent at least for the light emitted by the light source.

9. The proximity switch of claim 1, wherein the portions of the mirror are concave and have a parabolical or spherical shape.

10. The proximity switch of claim 1, wherein the opening of the concave mirror is completely covered by a plate which is transparent at least for the light emitted by the light source.

11. The proximity switch of claim 10, wherein at least the surface of the plate representing an external surface of the switch is essentially plane in order to ensure a small dispersion of the transiting light.

* * * * *